US012813037B2

(12) United States Patent
Pertuit et al.

(10) Patent No.: US 12,813,037 B2
(45) Date of Patent: Nov. 24, 2026

(54) MATERIAL ARRANGEMENTS IN COVER STRUCTURES FOR LIGHT-EMITTING DIODES

(71) Applicant: CreeLED, Inc., Durham, NC (US)

(72) Inventors: Andre Pertuit, Raleigh, NC (US); Michael Check, Holly Springs, NC (US); David Suich, Durham, NC (US); Colin Blakely, Raleigh, NC (US); Robert Wilcox, Rolesville, NC (US)

(73) Assignee: CreeLED, Inc., Durham, NC (US)

( * ) Notice: Subject to any disclaimer, the term of this patent is extended or adjusted under 35 U.S.C. 154(b) by 443 days.

(21) Appl. No.: 18/163,391

(22) Filed: Feb. 2, 2023

(65) Prior Publication Data

US 2024/0266482 A1 Aug. 8, 2024

(51) Int. Cl.

*H10H 20/855* (2025.01)
*H10H 20/822* (2025.01)
*H10H 20/851* (2025.01)

(52) U.S. Cl.

CPC ........ *H10H 20/855* (2025.01); *H10H 20/822* (2025.01); *H10H 20/8513* (2025.01)

(58) Field of Classification Search

CPC . H10H 20/822; H10H 20/8513; H10H 20/882

(Continued)

(56) References Cited

U.S. PATENT DOCUMENTS 9,960,322 B2 5/2018 van de Ven
11,101,410 B2 8/2021 Hussell (Continued)

FOREIGN PATENT DOCUMENTS

CN 204387807 U 6/2015
JP 2014193580 A 10/2014

(Continued)

OTHER PUBLICATIONS

International Search Report and Written Opinion for International Patent Application No. PCT/US2024/013403, mailed Jun. 17, 2024, 28 pages.

(Continued)

*Primary Examiner* — Eliseo Ramos Feliciano
*Assistant Examiner* — Mikka Liu
(74) *Attorney, Agent, or Firm* — Withrow & Terranova, P.L.L.C.

(57) ABSTRACT

Solid-state lighting devices including light-emitting diodes (LEDs) and more particularly material arrangements in cover structures for LEDs that tailor light emissions are disclosed. Material arrangements include light-filtering particles or ionic species that are integrated within materials of covers structures that cover LED chips within LED packages. Light-filtering materials may be configured to selectively filter one or more portions of light provided by LED chips and/or lumiphoric materials within LED packages. Dispersing light-filtering materials within covers structures provides protection and mechanical support for the light-filtering materials. Additionally, arrangements and concentrations of light-filtering materials within cover structures may be varied horizontally and/or vertically to tailor emission patterns of corresponding LED packages. Material arrangements include light-filtering species incorporated at an atomic level within cover structures. Further material arrangements include photochromic particles configured to proportionally scatter light based on relative intensities of light from LED chips.

22 Claims, 6 Drawing Sheets

(58) Field of Classification Search
USPC .......................................................... 257/79
See application file for complete search history.

(56) References Cited

U.S. PATENT DOCUMENTS

| | | | | |
|---|---|---|---|---|
| 2010/0277673 | A1 | 11/2010 | Hoelen et al. | |
| 2011/0001151 | A1 | 1/2011 | Le Toquin | |
| 2011/0012141 | A1* | 1/2011 | Le Toquin | H10H 20/8512 257/E33.059 |
| 2011/0260195 | A1 | 10/2011 | Chakraborty et al. | |
| 2013/0026514 | A1* | 1/2013 | Lin | H10H 20/8513 257/E33.061 |
| 2015/0034990 | A1* | 2/2015 | Roitman | H10H 20/841 257/98 |
| 2015/0069430 | A1 | 3/2015 | Collins et al. | |
| 2017/0037308 | A1* | 2/2017 | Römer | H10H 20/84 |
| 2017/0067620 | A1 | 3/2017 | Sano et al. | |
| 2017/0306221 | A1* | 10/2017 | Koole | C03C 14/004 |
| 2018/0040786 | A1* | 2/2018 | Chen | H10H 20/8513 |
| 2019/0035987 | A1* | 1/2019 | Yuasa | H10H 20/8514 |
| 2019/0187545 | A1* | 6/2019 | Arakawa | H04N 9/3164 |
| 2020/0011508 | A1 | 1/2020 | Wyatt | |
| 2020/0135988 | A1* | 4/2020 | Jiang | H10H 29/142 |
| 2021/0328112 | A1* | 10/2021 | McFarlane | H10H 20/854 |
| 2022/0165923 | A1 | 5/2022 | Kamp et al. | |
| 2022/0254962 | A1 | 8/2022 | Miller et al. | |
| 2022/0367761 | A1 | 11/2022 | Hong et al. | |
| 2023/0080947 | A1 | 3/2023 | Blakely et al. | |

FOREIGN PATENT DOCUMENTS

| | | | |
|---|---|---|---|
| JP | 2017054102 | A | 3/2017 |
| JP | 2018056552 | A | 4/2018 |
| TW | 201312053 | A | 3/2013 |
| WO | 2008156518 | A1 | 12/2008 |

OTHER PUBLICATIONS

Examination Report for Taiwanese Patent Application No. 113102689, mailed Nov. 20, 2024, 14 pages.
Notice of Preliminary Rejection for Korean Patent Application No. 10-2025-7028813, mailed Jul. 1, 2026, 16 pages.
Notice of Reasons for Rejection for Japanese Patent Application No. 2025-544849, mailed Sep. 2, 2026, 10 pages.

* cited by examiner

MATERIAL ARRANGEMENTS IN COVER STRUCTURES FOR LIGHT-EMITTING DIODES

FIELD OF THE DISCLOSURE

The present disclosure relates to solid-state lighting devices including light-emitting diodes (LEDs) and more particularly to material arrangements in cover structures for LEDs.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. Photons generated by the active region are initiated in all directions. Lumiphoric materials may be arranged that convert at least some light generated from the active regions of LED chips to a different wavelength.

LED packages have been developed that provide mechanical support, electrical connections, and encapsulation for LED emitters and lumiphoric materials. As LED technology continues to advance, LED packages are needed that emit light of high color quality for various applications. Despite recent advances in LED package technology, challenges remain for producing high quality light with desired emission characteristics while also providing high light emission efficiency in LED packages.

The art continues to seek improved LEDs and solid-state lighting devices having desirable illumination characteristics capable of overcoming challenges associated with conventional LED devices.

SUMMARY

The present disclosure relates to solid-state lighting devices including light-emitting diodes (LEDs) and more particularly to material arrangements in cover structures for LEDs that tailor light emissions. Material arrangements include light-filtering particles or ionic species that are integrated within materials of covers structures that cover LED chips within LED packages. Light-filtering materials may be configured to selectively filter one or more portions of light provided by LED chips and/or lumiphoric materials within LED packages. Integrating light-filtering materials within covers structures provides protection and mechanical support for the light-filtering materials. Additionally, arrangements and concentrations of light-filtering materials within cover structures may be varied horizontally and/or vertically to tailor emission patterns of corresponding LED packages. Material arrangements include light-filtering species incorporated at an atomic level within cover structures. Further material arrangements include photochromic particles configured to proportionally scatter light based on relative intensities of light from LED chips.

In one aspect, an LED package comprises: a submount; at least one LED chip on the submount, the at least one LED chip being configured to generate light in a first peak wavelength range; and a cover structure on the at least one LED chip, the cover structure comprising a plurality of light-filtering materials integrated within the cover structure, the light-filtering materials configured to reduce emissions of certain wavelengths of light that exit the cover structure. In certain embodiments, the plurality of light-filtering materials comprises a plurality of light-filtering particles. In certain embodiments, the plurality of light-filtering materials comprises a plurality of light-filtering ionic species that are incorporated within a host material of the cover structure. In certain embodiments, the light-filtering materials are configured to reduce amounts of light within at least a portion of the first peak wavelength range that exit the cover structure without wavelength conversion of the light of the first peak wavelength range within the cover structure. In certain embodiments, the cover structure comprises glass, and the plurality of light-filtering materials are integrated within the glass.

In certain embodiments, the LED package may further comprise a lumiphoric material between the cover structure and the at least one LED chip, the lumiphoric material configured to convert a portion of the light in the first peak wavelength range to light with a second peak wavelength range. In certain embodiments, the light-filtering materials are configured to reduce greater amounts of light within at least a portion of the first peak wavelength range that exit the cover structure than amounts of light within the second peak wavelength range. In certain embodiments, the light-filtering materials are configured to reduce amounts of light within at least a portion of the second peak wavelength range that exit the cover structure. In certain embodiments, the light-filtering materials are configured to reduce emissions of wavelengths of light below 400 nanometers that exit the cover structure. In certain embodiments, the light-filtering materials are configured to reduce emissions of wavelengths of light above 700 nanometers that exit the cover structure. In certain embodiments, the LED package may further comprise lumiphoric material particles dispersed with the light-filtering materials within the cover structure.

In certain embodiments, the light-filtering materials are arranged with higher concentrations near peripheral edges of the cover structure than central portions of the cover structure. In certain embodiments, the light-filtering materials are arranged with higher concentrations along central portions of the cover structure than near peripheral edges of the cover structure. In certain embodiments, the light-filtering materials are arranged with concentrations that vertically vary within the cover structure relative to the LED chip. In certain embodiments, the light-filtering materials comprise at least a first filter type and a second filter type, and the second filter type is configured to selectively filter a different wavelength range than the first filter type.

In another aspect, an LED package comprises: a submount; at least one LED chip on the submount; and a plurality of photochromic particles provided on the at least one LED chip, the plurality of photochromic particles configured to variably scatter light from the at least one LED chip based on relative intensity of the light from the at least one LED chip. In certain embodiments, the plurality of photochromic particles are configured to decrease scattering of the light from the at least one LED chip when the intensity of light from the at least one LED chip decreases. The LED package may further comprise a cover structure on the at least one LED chip, wherein the plurality of photochromic particles are dispersed within the cover structure. The LED package may further comprise light-filtering particles dispersed within the cover structure. The LED package may further comprise lumiphoric material particles dispersed within the cover structure In certain embodiments, the plurality of photochromic particles are configured to decrease scattering of the light from lumiphoric material particles when the intensity of light from the at least one LED chip decreases. In certain embodiments, the plurality of photochromic particles comprise one or more of organic compounds, silicate photochromic glasses containing silver halide microcrystals, and activated crystals of alkali metal-halide compounds.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
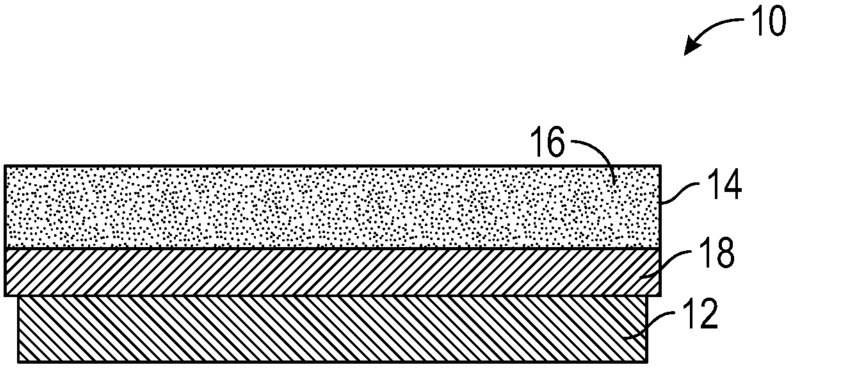
FIG. 1A is a cross-sectional view of a light-emitting diode (LED) package that includes an LED chip with a cover structure that includes light-filtering materials according to aspects disclosed herein.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to solid-state lighting devices including light-emitting diodes (LEDs) and more particularly to material arrangements in cover structures for LEDs that tailor light emissions. Material arrangements include light-filtering particles or ionic species that are integrated within materials of covers structures that cover LED chips within LED packages. Light-filtering materials may be configured to selectively filter one or more portions of light provided by LED chips and/or lumiphoric materials within LED packages. Dispersing light-filtering materials within covers structures provides protection and mechanical support for the light-filtering materials. Additionally, arrangements and concentrations of light-filtering materials within cover structures may be varied horizontally and/or vertically to tailor emission patterns of corresponding LED packages. Material arrangements include light-filtering species incorporated at an atomic level within cover structures. Further material arrangements include photochromic particles configured to proportionally scatter light based on relative intensities of light from LED chips.

Before delving into specific details of various aspects of the present disclosure, an overview of various elements that may be included in exemplary LED packages of the present disclosure is provided for context. An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, undoped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). Other material systems include silicon carbide (SiC), organic semiconductor materials, and other Group III-V systems such as gallium phosphide (GaP), gallium arsenide (GaAs), and related compounds. The active LED structure may be grown on a growth substrate that can include many materials, such as sapphire, SiC, aluminum nitride (AlN), and GaN.

Different embodiments of the active LED structure can emit different wavelengths of light depending on the composition of the active layer and n-type and p-type layers. In some embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 650 nm. Other wavelength ranges include a range from 400 nm to about 430 nm and/or a range from 480 nm to 500 nm, among others, or any wavelength in a range from 400 nm to 750 nm. In certain embodiments, the active LED structure may be configured to emit light that is outside the visible spectrum, including one or more portions of the ultraviolet (UV) spectrum. The UV spectrum is typically divided into three wavelength range categories denotated with letters A, B, and C. In this manner, UV-A light is typically defined as a peak wavelength range from 315 nm to 400 nm, UV-B is typically defined as a peak wavelength range from 280 nm to 315 nm, and UV-C is typically defined as a peak wavelength range from 100 nm to 280 nm. UV LEDs are of particular interest for use in applications related to the disinfection of microorganisms in air, water, and surfaces, among others. In other applications, UV LEDs may also be provided with one or more lumiphoric materials to provide LED packages with aggregated emissions having a broad spectrum and improved color quality for visible light applications.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of UV LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure may be useful for LED chips having a variety of geometries, including flip-chip geometries. Flip-chip structures for LED chips typically include anode and cathode connections that are provided from a same side or face of the LED chip. The anode and cathode side is typically structured as a mounting face of the LED chip for flip-chip mounting to another surface, such as a printed circuit board. In this regard, the anode and cathode connections on the mounting face serve to mechanically bond and electrically couple the LED chip to the other surface. When flip-chip mounted, the opposing side or face of the LED chip corresponds with a light-emitting face that is oriented toward an intended emission direction. In certain embodiments, a growth substrate for the LED chip may form and/or be adjacent to the light-emitting face when flip-chip mounted. During chip fabrication, the active LED structure may be epitaxially grown on the growth substrate.

According to aspects of the present disclosure, LED packages may include one or more elements, such as cover structures with lumiphoric materials or phosphors for wavelength conversion, encapsulants, light-altering materials, lenses, and electrical contacts, among others, that are provided with one or more LED chips. In certain aspects, an LED package may include a support structure or member, such as a submount or a lead frame. A support structure may refer to a structure of an LED package that supports one or more other elements of the LED package, including but not limited to LED chips and cover structures. In certain embodiments, a support structure may include a submount on which an LED chip is mounted. Suitable materials for a submount include, but are not limited to, ceramic materials such as aluminum oxide or alumina, AlN, or organic insulators like polyimide (PI) and polyphthalamide (PPA). In other embodiments a submount may comprise a printed circuit board (PCB), sapphire, Si, or any other suitable material. For PCB embodiments, different PCB types can be used such as standard FR-4 PCB, metal core PCB, or any other type of PCB. In still further embodiments, the support structure may embody a lead frame structure. Aspects of the present disclosure are provided in the context of support structures for LED chips that may emit light in any number of wavelength ranges, including wavelengths within UV and/or visible light spectrums.

Light-altering materials may be arranged within LED packages to reflect or otherwise redirect light from the one or more LED chips in a desired emission direction or pattern. As used herein, light-altering materials may include many different materials including light-reflective materials that reflect or redirect light, light-absorbing materials that absorb light, and materials that act as a thixotropic agent. As used herein, the term "light-reflective" refers to materials or particles that reflect, refract, scatter, or otherwise redirect light. For light-reflective materials, the light-altering material may include at least one of fused silica, fumed silica, titanium dioxide ($TiO_2$), or metal particles suspended in a binder, such as silicone or epoxy. For light-absorbing materials, the light-altering material may include at least one of carbon, silicon, or metal particles suspended in a binder, such as silicone or epoxy. The light-reflective materials and the light-absorbing materials may comprise nanoparticles. In certain embodiments, the light-altering material may comprise a generally white color to reflect and redirect light. In other embodiments, the light-altering material may comprise a generally opaque or black color for absorbing light and increasing contrast.

An LED chip can also be covered or otherwise arranged to emit light toward one or more lumiphoric materials (also referred to herein as lumiphors), such as phosphors, such that at least some of the light from the LED chip is absorbed by the one or more lumiphors and is converted to one or more different wavelength spectra according to the characteristic emission from the one or more lumiphors. In this regard, at least one lumiphor receiving at least a portion of the light generated by the LED source may re-emit light having different peak wavelength than the LED source. An LED source and one or more lumiphoric materials may be selected such that their combined output results in light with one or more desired characteristics such as color, color point, intensity, etc. In certain embodiments, aggregate emissions of LED chips, optionally in combination with one or more lumiphoric materials, may be arranged to provide cool white, neutral white, or warm white light, such as within a color temperature range of from 2500 Kelvin (K) to 10,000K. In certain embodiments, lumiphoric materials having cyan, green, amber, yellow, orange, and/or red peak wavelengths may be used. In some embodiments, the combination of the LED chip and the one or more lumiphors (e.g., phosphors) emits a generally white combination of light. The one or more phosphors may include yellow (e.g., YAG:Ce), green (e.g., LuAg:Ce), and red (e.g., $Ca_{i-x-y}Sr_xEu_yAlSiN_3$) emitting phosphors, and combinations thereof.

Lumiphoric materials as described herein may be or include one or more of a phosphor, a scintillator, a lumiphoric ink, a quantum dot material, a day glow tape, and the like. Lumiphoric materials may be provided by any suitable means, for example, dispersal in a host material or an encapsulant material. In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied relative to one or more outer surfaces of an LED chip. In certain embodiments, one or more lumiphoric materials may be patterned relative to one or more surfaces of an LED chip to include one or more stripes, dots, curves, or polygonal shapes. In certain embodiments, multiple lumiphoric materials may be arranged in different discrete regions or discrete layers on or over an LED chip.

In certain embodiments, one or more lumiphoric materials may be provided as at least a portion of a wavelength conversion element or a cover structure for an LED package. Wavelength conversion elements or cover structures may include phosphor-in-glass or phosphor-in-ceramic arrangements. Phosphor-in-glass or ceramic arrangements may be formed by mixing phosphor particles with glass frit or ceramic materials, pressing the mixture into planar shapes, and firing or sintering the mixture to form a hardened structure that can be cut or separated into individual wavelength conversion elements. For certain phosphor-in-glass arrangements, multiple sheets of precursor materials, such as glass frit and a corresponding binder, may be laminated and fired together. Wavelength conversion elements may be attached to one or more LED chips using, for example, a layer of transparent adhesive. In certain embodiments, the layer of the transparent adhesive may include silicone with a refractive index in a range of about 1.3 to about 1.6 that is less than a refractive index of the LED chip on which the wavelength conversion element is placed.

Aspects of the present disclosure may include specific arrangements of materials that may be provided within cover structures for LED packages for altering and/or improving emission characteristics. Such cover structures may include hard and mechanically robust structures that are positioned over one or more LED chips within an LED package. Cover structures may be formed of a host material such as glass or ceramic, formed by glass frit and/or laminated sheets of glass frit, or various ceramic materials. As will be further described with regard to specific embodiments, lumiphoric materials may be provided as separate layers on cover structures or lumiphoric materials may be embedded within cover structures. A cover structure may be configured to provide protection from environmental exposure to underlying portions of an LED package, thereby providing a more robust LED package that is well suited for applications that require high power with increased light intensity, contrast, and reliability, such as interior and exterior automotive applications. The light-filtering materials for altering and/or improving emission characteristics may include light-filtering particles or ionic species that are configured to selectively filter certain wavelengths of light. In various aspects, light-filtering materials may include but are not limited to inorganic materials, dielectric materials, and metal materials. Exemplary light-filtering materials may embody molecules, ions, particles, and/or scattering particles of various materials. In still further examples, light-filtering ionic species are incorporated at an atomic level with materials of the cover structure. Light-filtering ionic species may include chromium-based materials, cadmium-based materials, and/or cobalt-based materials, among others.

As used herein, light-filtering materials and/or particles may include various arrangements with variable distributions, particle sizes and/or index of refraction differences with surrounding cover structure materials that collectively provide the ability to pass certain wavelengths of light while reflecting, redirecting, or otherwise absorbing other wavelengths of light. In various arrangements, light-filtering materials as described herein may form one or more of a band-pass filter, a high-pass filter, a low-pass filter, and a notch or band-stop filter for light passing through a corresponding cover structure. A band-pass filter may be configured to promote wavelengths within a particular range to pass through while reflecting wavelengths outside of the particular range. A low-pass filter may promote wavelengths below a certain value to pass through while reflecting higher wavelengths. A high-pass filter may promote wavelengths above a certain value to pass through while reflecting lower wavelengths. Finally, a notch or band-stop filter may promote wavelengths within a particular range to be reflected while promoting wavelengths outside of the particular range to pass through. Specific arrangements of light-filtering materials in LED packages are disclosed that may promote reflection of unconverted light (e.g., from an LED chip) back into lumiphoric materials, thereby improving light-conversion efficiency and allowing potential reduction in thickness of the lumiphoric materials. Such reduction in thickness and corresponding amounts of lumiphoric material may further serve to reduce heat generation from the lumiphoric material during operation.

FIGS. 1A-9 are discussed below in the general context of light-filtering materials. The principles disclosed are equally applicable to any light-filtering materials that may be incorporated within the cover structure, such as light-filtering ionic species and/or light-filtering particles. In this regard, the locations of the light-filtering materials described below for FIGS. 1A-9 may represent locations of light-filtering ionic species within a host material or matrix, such as glass or ceramic, of the cover structure or locations of light-filtering particles that may be dispersed within the cover structure. In still further embodiments, the light-filtering materials described below for FIGS. 1A-9 may include multiple types of filtering materials and/or particles that are configured to provide different filtering properties from one another.

FIG. 1A is a cross-sectional view of an LED package 10 that includes an LED chip 12 with a cover structure 14 that includes light-filtering materials 16 according to aspects disclosed herein. As illustrated, the light-filtering materials 16 are embedded or otherwise integrated within the host material of the cover structure 14. For example, a base material of the cover structure 14 may include glass, and the light-filtering materials 16 are distributed throughout the glass. By incorporating the light-filtering materials 16 within the cover structure 14, rather than as a separate film or coating, the material of the cover structure 14 may effectively provide encapsulation and environmental protection for the light-filtering materials 16. In certain embodiments, the LED package 10 may further include a lumiphoric material 18 arranged in a light-receiving position relative to the LED chip 12. The lumiphoric material 18 may be provided as a coating or layer on the cover structure 14, such as a layer of silicone embedded with one or more types of phosphor particles. In other embodiments, the lumiphoric material 18 may embody a pre-formed and hardened structure that is attached to the LED chip 12 and/or the cover structure 14. Such pre-formed structures may include phosphor-in-glass or ceramic phosphor plate arrangements.

Figure 1B:
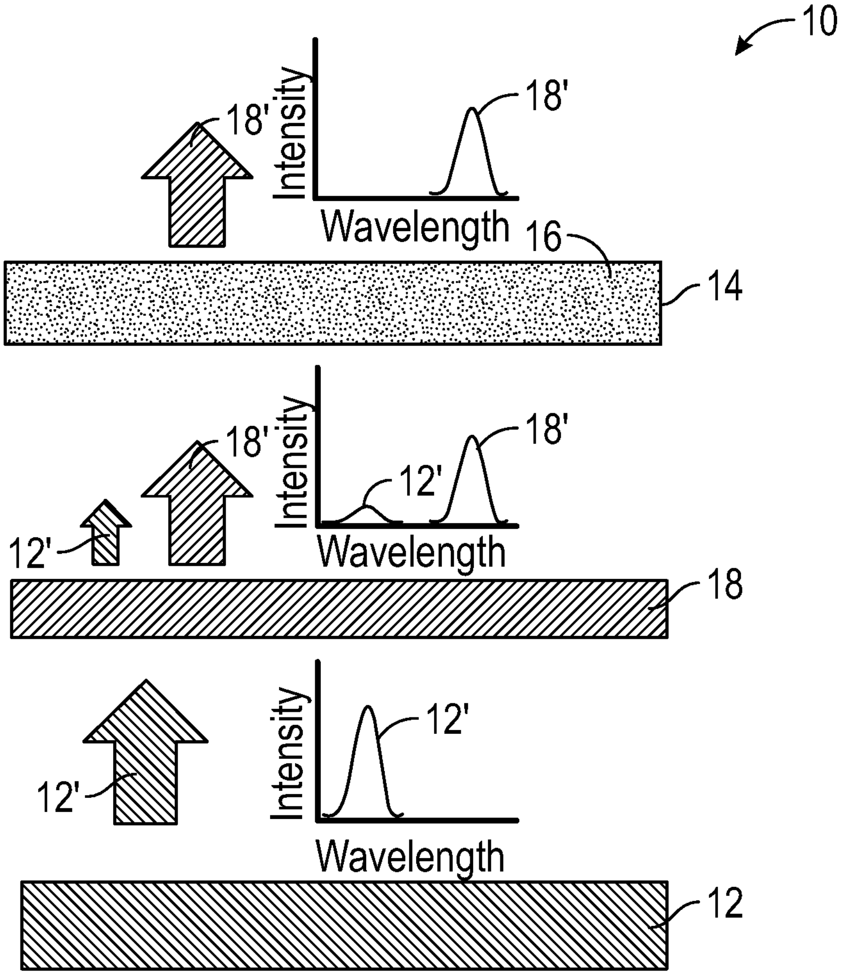
FIG. 1B is an exploded view of the LED package of FIG. 1A with superimposed light spectrum plots illustrating exemplary filtering characteristics.

FIG. 1B is an exploded view of the LED package 10 of FIG. 1A with superimposed light spectrum plots illustrating exemplary filtering characteristics. The LED chip 12 is configured to generate light of a first peak wavelength 12' or in a first peak wavelength range. The superimposed arrow for the first peak wavelength 12' and corresponding spectrum plot with only the first peak wavelength 12' are provided above the LED chip 12 to indicate a direction of light propagation and the corresponding spectrum of light before reaching the lumiphoric material 18. After passing through the lumiphoric material 18, a portion of the first peak wavelength 12' is converted to a light of a second peak wavelength 18' or a second peak wavelength range. Accordingly, the size of the superimposed arrow for the first peak wavelength 12' is reduced above the lumiphoric material 18 and another arrow representing the second peak wavelength 18' is illustrated. Additionally, the corresponding spectrum plot above the lumiphoric material 18 shows a reduction in intensity of the first peak wavelength 12' along with the presence of the second peak wavelength 18'. In this example, the light-filtering materials 16 of the cover structure 14 are configured to selectively filter light of the first peak wavelength 12'. Accordingly, light that exits the cover structure 14 may predominantly be of the second peak wavelength range 18', such as at least 95%, or at least 97%, or at least 99% of the overall emissions. Such an LED package 10 may be referred to as a saturated emitter package where aggregate emissions are predominantly provided by converted light from the lumiphoric material 18. In the case of a range of values for the first peak wavelength, the light-filtering materials 16 may filter the entire first peak wavelength range or a portion or subset of the first peak wavelength range. In a particular example, the first peak wavelength may be in a range from 430 nm to 480 nm and the second peak wavelength is in a range from 500 to 650 nm.

In other embodiments, the LED package 10 may not embody a so-called saturated emitter package. Instead, the light-filtering materials 16 may be employed to selectively dim aggregate emissions, particularly for end applications where light intensities should be at or below threshold brightness levels. In this manner, the light-filtering materials 16 may be provided with a reduced loading as compared with the saturated emitter embodiments, thereby only filtering a controlled portion of the overall light. In such examples, the light-filtering materials 16 may be configured to filter a certain percentage of the first peak wavelength 12', or a certain percentage of the second peak wavelength 18', or certain percentages of both.

In other embodiments, the light-filtering materials 16 may be configured to filter a subset or only a portion of the first peak wavelength range and/or the second peak wavelength range. For example, the first peak wavelength may be in a range from 430 nm to 480 nm, while an edge of the corresponding emission spectrum may extend below 400 nm and into UV emissions. In certain embodiments, the light-filtering materials 16 may be configured to selectively filter wavelengths below 400 nm while allowing the other wavelengths to pass. In another example, the light-filtering materials 16 could be configured to selectively filter wavelengths of 700 nm or above.

In other embodiments, the light-filtering materials 16 may embody multiple filtering types that selectively filter different peak wavelength ranges. For example, the light-filtering materials 16 may include a first filtering type that selectively filters wavelengths below 400 nm and a second filtering type that selectively filters wavelengths of 700 nm or above. In another example, the first and/or second filter types could selectively filter certain wavelength bands within a larger range from 400 nm to 700 nm.

Figure 2:
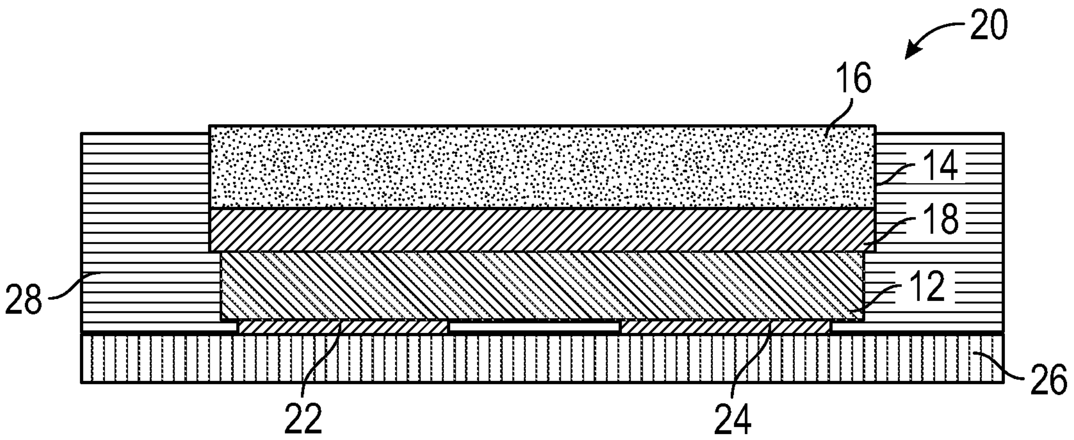
FIG. 2 is a cross-sectional view of an LED package that is similar to the LED package of FIG. 1 and further illustrates additional package elements.

FIG. 2 is a cross-sectional view of an LED package 20 that is similar to the LED package 10 of FIG. 1 and further illustrates additional package elements. In FIG. 2, the LED chip 12 has a flip-chip orientation such that an anode contact 22 and a cathode contact 24 are accessible from a same side of the LED chip 12 for flip-chip mounting to a submount 26. The submount 26 typically includes corresponding electrical traces for routing electrical connections to the LED chip 12. While a single LED chip 12 is illustrated, a plurality of LED chips 12 could be mounted on the submount 26, each with their own cover structure 14, or beneath a common cover structure 14 for multiple LED chips.

As illustrated in FIG. 2, a light-altering layer 28 may be provided on the submount 26 and surrounding lateral edges of the LED chip 12. The light-altering layer 28 may include a light-reflective material and/or a light-refracting material that effectively redirects laterally propagating light back toward a desired emission direction, such as through the cover structure 14. In certain embodiments, the light-altering layer 28 may also surround lateral edges of lumiphoric material 18. In this manner, the cover structure 14 forms the emission surface of the LED package 20 and laterally propagating light from either the LED chip 12 or the lumiphoric material 18 may be redirected for interaction with the light-filtering materials 16 of the cover structure 14. In still further embodiments, the light-altering layer 28 may surround lateral edges of the cover structure 14 to shape emission patterns exiting the LED package 20. As illustrated, a portion of the cover structure 14 may be arranged to protrude above the light-altering material 28. In this manner, a clearance may be provided to account for manufacturing variations to avoid inadvertently forming the light-altering material 28 on a top surface of the cover structure 14. For light-reflecting embodiments, the light-altering layer 28 may have a predominantly white color. Alternatively, the light-altering material 28 may be provided with a predominantly black color to provide increased contrast for light passing through the cover structure 14. In certain embodiments, the light-altering material 28 as described for FIG. 2 may also be implemented in any of the following embodiments described for FIGS. 3 to 10A.

Figure 3:
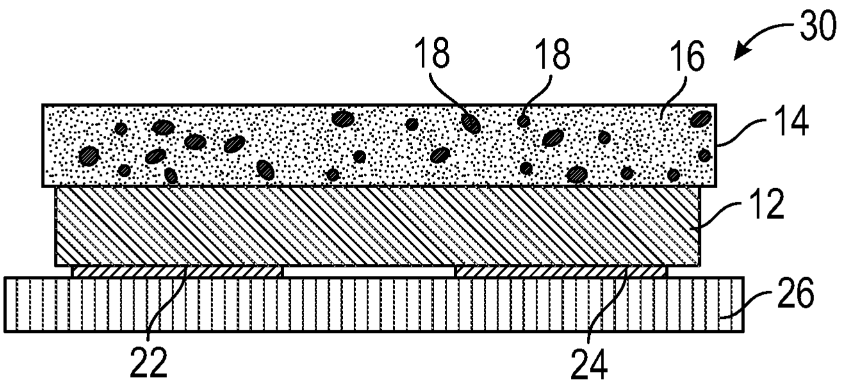
FIG. 3 is a cross-sectional view of an LED package that is similar to the LED package of FIG. 2 for embodiments where a lumiphoric material is provided as lumiphoric particles that are dispersed within the cover structure along with the light-filtering materials.

FIG. 3 is a cross-sectional view of an LED package 30 that is similar to the LED package 20 of FIG. 2 for embodiments where the lumiphoric material 18 is provided as lumiphoric particles that are dispersed within the cover structure 14 along with the light-filtering materials 16. In this manner, the particles of the lumiphoric material 18 and the light-filtering materials 16 may be concurrently embedded and mixed together within the cover structure 14. In certain embodiments, such an arrangement may avoid the need for a separate layer or structure for the lumiphoric material 18. The cover structure 14 may accordingly embody a phosphor-in-glass structure that also exhibits light-filtering characteristics.

Figure 4:
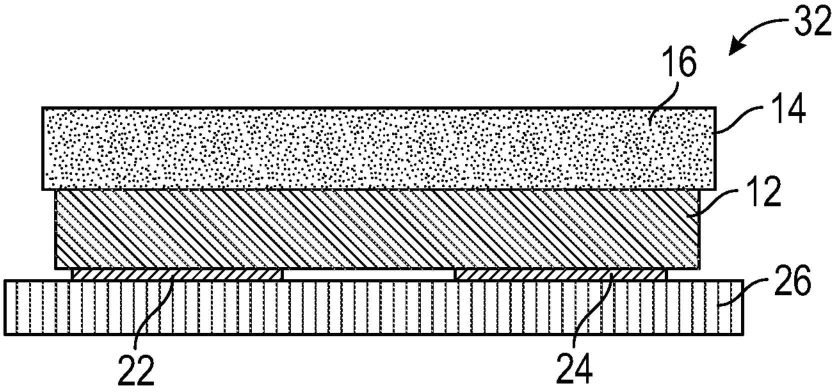
FIG. 4 is a cross-sectional view of an LED package that is similar to the LED package of FIG. 2 for embodiments where the LED package does not include lumiphoric materials.

FIG. 4 is a cross-sectional view of an LED package 30 that is similar to the LED package 20 of FIG. 2 for embodiments where the LED package 30 does not include lumiphoric materials. Accordingly, the cover structure 14 with the light-filtering materials 16 may be provided on the LED chip 12 to filter portions of light generated by the LED chip 12. For example, the light-filtering materials 16 may filter edges of the emission spectrum below 400 nm or above 700 nm depending on the embodiment. In other embodiments, the light-filtering materials 16 may be arranged with a loading that reduces a brightness of peak wavelengths emitted to effectively dim the LED chip 12 to a target brightness.

FIGS. 5-9 illustrate various embodiments where arrangements of light-filtering materials 16 are varied horizontally or vertically within cover structures 14 to provide various emission patterns. According to aspects disclosed herein, the ability to disperse or otherwise embed light-filtering materials 16 in a cover structure 14 allows the ability to vary localized concentrations of the light-filtering materials 16 within the cover structure 14 to tailor light emissions to target applications. In the context of glass for the base material of the cover structure 14, precursor sheets of glass frit may be arranged with different localized regions of light-filtering materials 16 and/or different sheets of glass frit with varying concentrations of light-filtering materials 16. Similar principles apply for precursor sheets of ceramic materials when the base material of the cover structure 14 is a ceramic.

Figure 5:
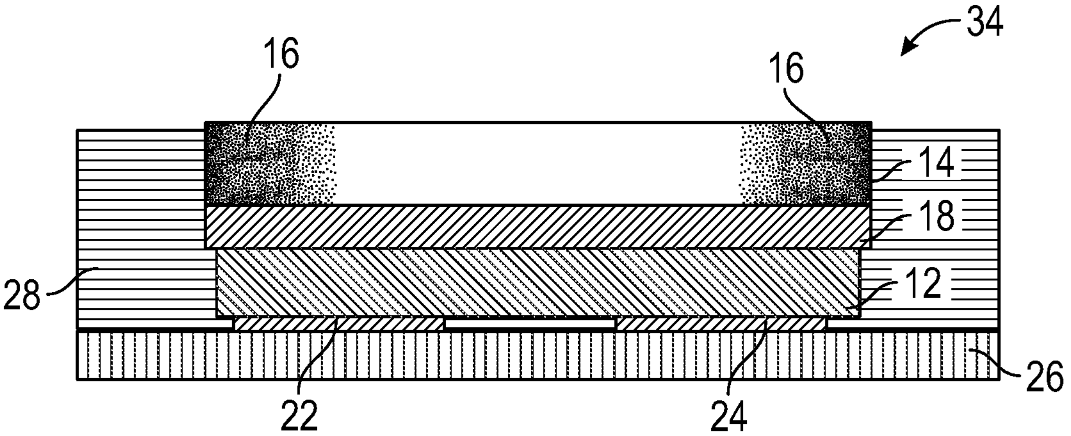
FIG. 5 is a cross-sectional view of an LED package that is similar to the LED package of FIG. 2 for embodiments where the light-filtering materials are arranged with increased loading along peripheral edges of the cover structure relative to central portions of the cover structure.

FIG. 5 is a cross-sectional view of an LED package 34 that is similar to the LED package 20 of FIG. 2 for embodiments where the light-filtering materials 16 are arranged with increased loading along peripheral edges of the cover structure 14 relative to central portions of the cover structure 14. Such an arrangement may help reduce nonuniformities in color mixing attributed to light from the LED chip 12 that may pass through reduced amounts of the lumiphoric material 18 along the perimeter of the LED package 34. In certain embodiments, the central region of the cover structure 14 may be devoid of the light-filtering materials 16 to promote increased emissions in a desired emission direction. As illustrated, the cover structure 14 may have a graded distribution of the light-filtering materials 16 from the peripheral edges to the central region. For example, in the context where the light-filtering materials 16 comprise light-filtering ionic species, the ionic species may be allowed to diffuse during formation of the cover structure 14 such that distinct boundaries are not necessarily present. Additionally, graded distributions of light-filtering particles could also be provided. In other embodiments, distinct boundaries of the light-filtering materials within the cover structure 14 could be defined.

Figure 6:
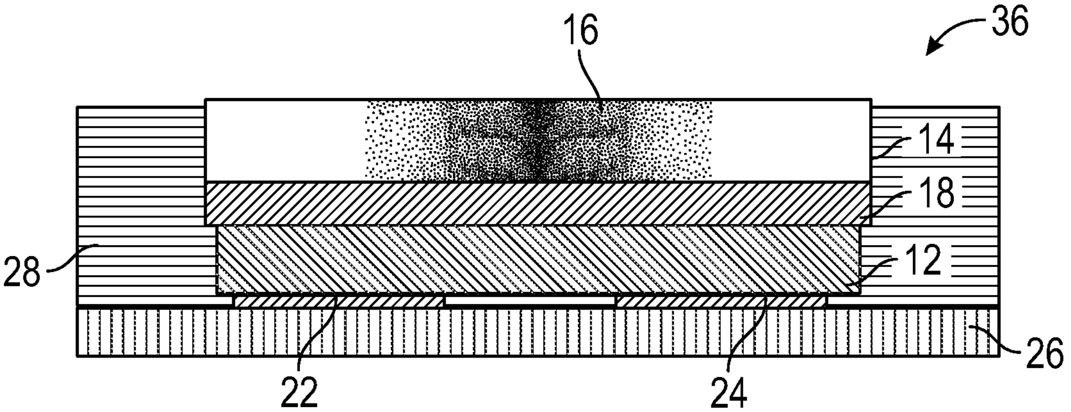
FIG. 6 is a cross-sectional view of an LED package that is similar to the LED package of FIG. 5 for embodiments where the light-filtering materials are arranged with increased loading along central portions of the cover structure relative to peripheral edges of the cover structure.

FIG. 6 is a cross-sectional view of an LED package 36 that is similar to the LED package 34 of FIG. 5 for embodiments where the light-filtering materials 16 are arranged with increased loading along central portions of the cover structure 14 relative to peripheral edges of the cover structure 14. Such an arrangement may be implemented to reduce the intensity of overall emissions of the LED package 36 by spatially reducing areas of highest intensities of light. Additionally, regions at or near peripheral edges of the cover structure 14 may be devoid of light-filtering materials 16. In a similar manner described above for FIG. 5, the light-filtering materials 16 could form graded distributions or distinct boundaries within the cover structure 14.

Figure 7:
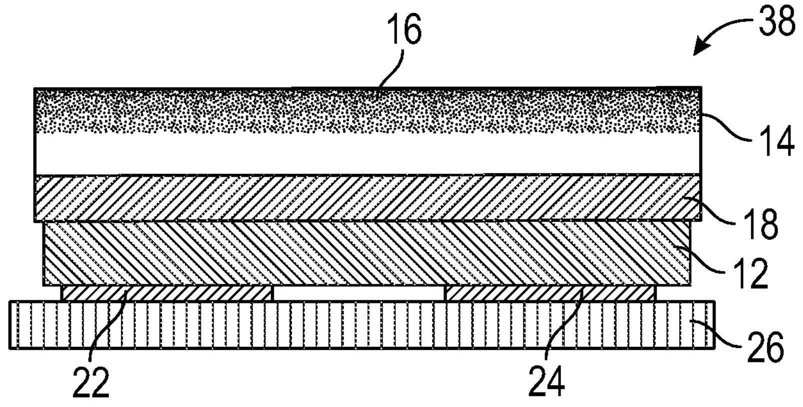
FIG. 7 is a cross-sectional view of an LED package that is similar to the LED package of FIG. 5 for embodiments where the light-filtering materials are arranged with increased concentrations near a top surface of the cover structure.

FIG. 7 is a cross-sectional view of an LED package 38 that is similar to the LED package 34 of FIG. 5 for embodiments where the light-filtering materials 16 are arranged with increased concentrations near a top surface of the cover structure 14. In this manner, portions of the cover structure 14 that do not include the light-filtering materials 16 are arranged between the light-filtering materials 16 and the LED chip 12. Such an arrangement may be advantageous to position any heat generated by the light-filtering materials 16 away from the LED chip 12. As described above, forming the cover structure 14 by laminating sheets of precursor materials allows the ability to vertically vary concentrations of the light-filtering materials 16. While the lumiphoric material 18 is illustrated in FIG. 7, the lumiphoric material 18 may be omitted in certain embodiments.

Figure 8:
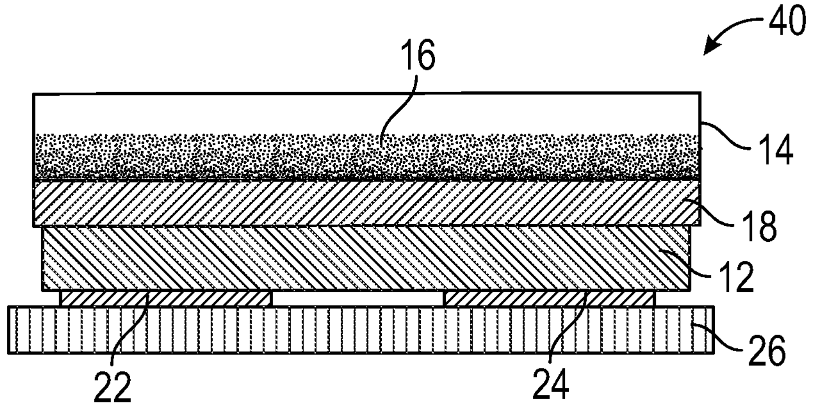
FIG. 8 is a cross-sectional view of an LED package that is similar to the LED package of FIG. 7 for embodiments where the light-filtering materials are arranged with increased concentrations near a bottom surface of the cover structure.

FIG. 8 is a cross-sectional view of an LED package 40 that is similar to the LED package 38 of FIG. 7 for embodiments where the light-filtering materials 16 are arranged with increased concentrations near a bottom surface of the cover structure 14. In FIG. 8, the light-filtering materials 16 are positioned closer to the LED chip 12. In a similar manner described above for FIG. 5, the light-filtering materials 16 could form graded distributions or distinct boundaries within the cover structure 14. In certain embodiments, the lumiphoric material 18 of FIG. 3 may also be integrated within the cover structure 14.

Figure 9:
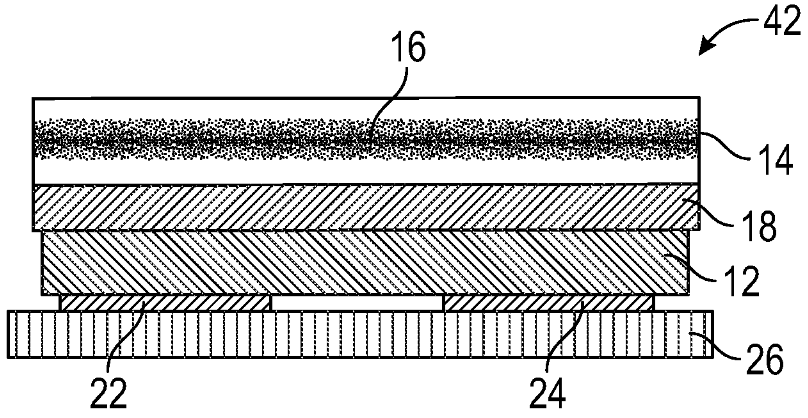
FIG. 9 is a cross-sectional view of an LED package that is similar to the LED package of FIG. 7 for embodiments where the light-filtering materials are arranged with increased concentrations vertically along middle portions of the cover structure.

FIG. 9 is a cross-sectional view of an LED package 42 that is similar to the LED package 38 of FIG. 7 for embodiments where the light-filtering materials 16 are arranged with increased concentrations vertically along middle portions of the cover structure 14. In a similar manner described above for FIG. 5, the light-filtering materials 16 could form graded distributions or distinct boundaries within the cover structure 14. In certain embodiments, the lumiphoric material 18 of FIG. 3 may also be integrated within the cover structure 14.

According to certain aspects of the present disclosure, photochromic particles may be incorporated in LED packages. Photochromic particles are arranged that employ photoactivated chemistry that is flux dependent based on relative intensity of light emitted from LED chips. For example, when light from the LED chip is at higher relative intensities, the photochromic particles may be configured to scatter higher amounts of light. Conversely, when light from the LED chip is provided with lower relative intensities, the photochromic particles may be configured to scatter reduced amounts of light. Increased scattering may reduce relative amounts of light that exit the LED package while reduced scattering may increase relative amounts of light that exit the LED package. In this manner, as an LED chip degrades in intensity over its lifetime, the action of the photochromic particles may serve to flatten or reduce the severity of the decrease. Exemplary photochromic materials for photochromic particles include: organic compounds, such as spiropyrans and dithizonates of metals; silicate photochromic glasses containing silver halide microcrystals, for example, silver bromide (AgBr) or silver chloride (AgCl); and activated crystals of alkali metal-halide compounds.

Figure 10A:
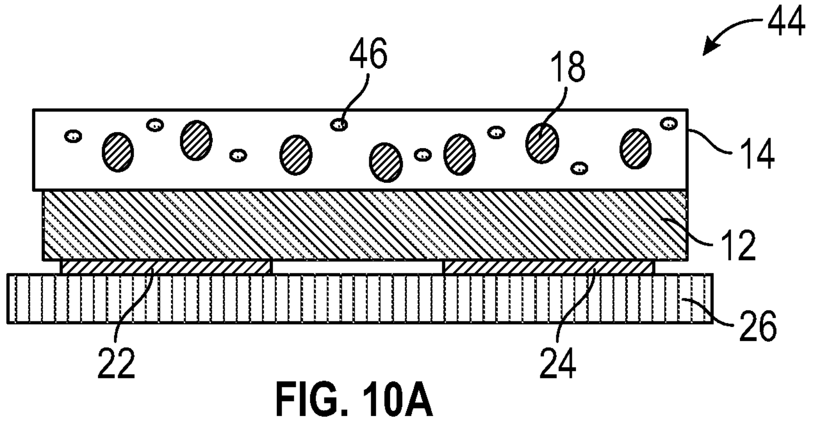
FIG. 10A is a cross-sectional view of an LED package that is similar to the LED package of FIG. 3 and includes photochromic particles according to aspects disclosed herein.
Figure 10B:
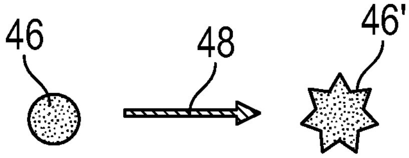
FIG. 10B is a cross-sectional view illustrating the response of a photochromic particle to increased light intensity.

FIG. 10A is a cross-sectional view of an LED package 44 that is similar to the LED package 30 of FIG. 3 and includes photochromic particles 46 according to aspects disclosed herein. In certain embodiments, the photochromic particles 46 may be dispersed or otherwise embedded within the cover structure 14. However, in other embodiments, the photochromic particles 46 may reside in other portions of the LED package 44, such as within encapsulant materials when the cover structure 14 is omitted. As described above, the photochromic particles 46 may be configured to scatter light from the LED chip 12 proportionally to an intensity of light provided by the LED chip 12. In certain embodiments, particles of the lumiphoric material 18 may also be incorporated within the cover structure 14 along with the photochromic particles 46. In this manner, the photochromic particles 46 may also scatter light from the lumiphoric material 18 proportional to an intensity of light from the LED chip 12. FIG. 10B is a cross-sectional view illustrating the response of a photochromic particle 46 to increased light intensity. In FIG. 10B, the photochromic particle 46 on the left is illustrated as a circle to represent no scattering or minimal scattering of light. An increase in light intensity is represented by the arrow 48. When the intensity of light is increased, a photochromic particle 46' exhibits increased scattering. For illustrative purposes, the photochromic particle 46' with increased scattering is represented as a star shape in FIG. 10B.

Figure 11A:
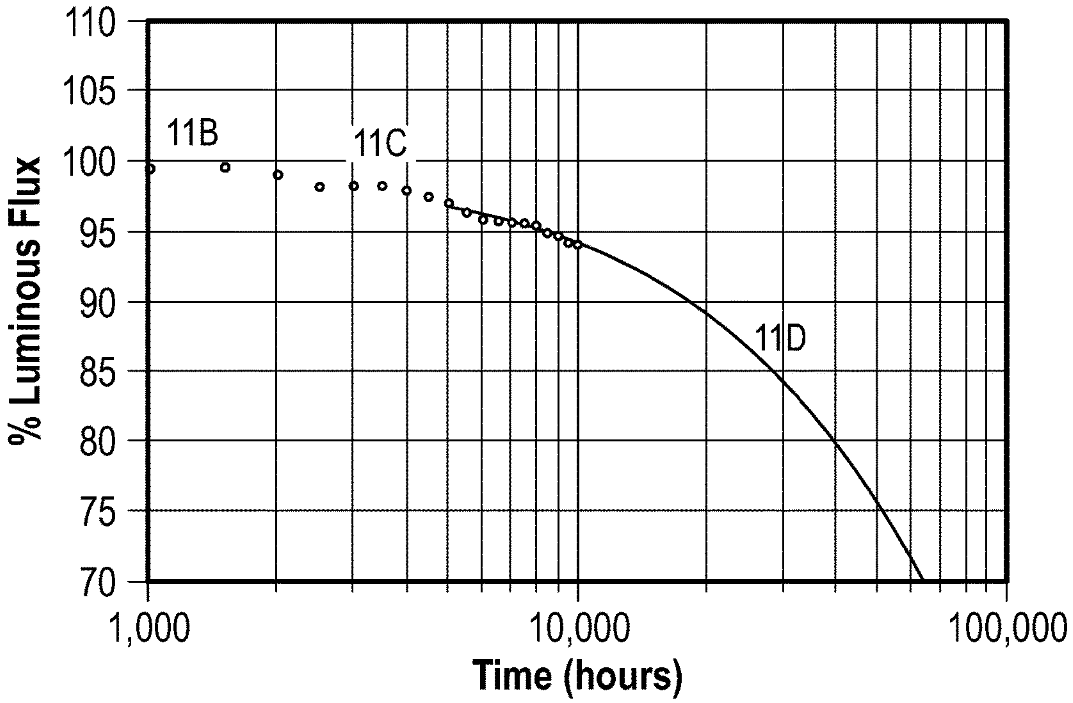
FIG. 11A is a plot illustrating a typical luminous decay over a lifetime of a blue LED chip.
Figure 11B:
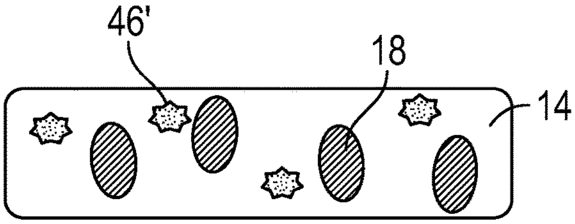
FIG. 11B is a cross-sectional view of a cover structure with photochromic particles receiving light from portions of the plot of FIG. 11A with highest intensities.
Figure 11C:
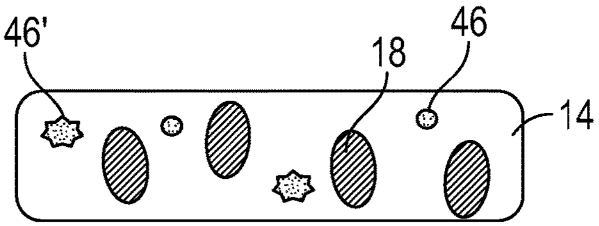
FIG. 11C is a cross-sectional view of the cover structure of FIG. 11B with photochromic particles receiving light from portions of the plot of FIG. 11A with reduced intensities from FIG. 11B.
Figure 11D:
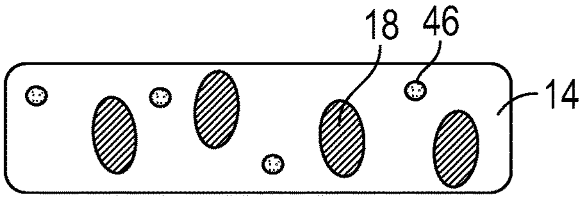
FIG. 11D is a cross-sectional view of the cover structure of FIGS. 11B and 11C with photochromic particles receiving light from portions of the plot of FIG. 11A with lower intensities as compared to FIGS. 11B and 11C.

FIG. 11A is a plot illustrating a typical luminous decay over a lifetime of a blue LED chip. The y-axis represents percent luminous flux while the x-axis represents time in hours. As illustrated, at an initial time of 1,000 hours, the percent luminous flux is near 100%. The luminous flux exhibits a gradual decay to fall below about 95% near 10,000 hours and a more rapid decay between 10,000 hours and 100,000 hours. By providing photochromic particles 46 that variably scatter light based on relative intensity, the decay associated with an LED chip as illustrated in FIG. 11A may be mitigated in overall LED package emissions. In FIG. 11A, markers are superimposed for the images of FIGS. 11B, 11C, and 11D, each of which represents exemplary responses of photochromic particles 46, 46' within the cover structure 14 to the various intensities of light. FIG. 11B corresponds to portions of the plot of FIG. 11A with highest intensities or luminous flux. FIG. 11C corresponds to portions of the plot of FIG. 11A with reduced intensities from FIG. 11B. Finally, FIG. 11D corresponds to portions of the plot of FIG. 11A with lower intensities as compared to FIGS. 11B and 11C. Accordingly, the photochromic particles 46, 46' exhibit highest amounts of light scattering in FIG. 11B, reduced amounts of light scattering in FIG. 11C, and little or no light scattering in FIG. 11D. Accordingly, when light intensities from the LED chip decay, the photochromic particles 46, 46' respond by scattering less light, thereby allowing more of the light to pass through the cover structure 14 without backscattering. In various embodiments, the photochromic particles 46, 46' may be provided alone, or in combination with the light-filtering materials 16 described above for FIG. 1A to FIG. 9.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) package comprising:

a submount;

at least one LED chip on the submount, the at least one LED chip being configured to generate light in a first peak wavelength range;

a cover structure on the at least one LED chip, the cover structure comprising a plurality of light-filtering materials integrated within the cover structure, the light-filtering materials configured to reduce amounts of light within at least a portion of the first peak wavelength range that exit the cover structure without wavelength conversion of the light of the first peak wavelength range within the cover structure; and a light-altering layer on a portion of the submount adjacent the at least one LED chip, the light-altering layer further arranged directly along lateral edges of the at least one LED chip and along lateral edges of the cover structure, the light-altering layer comprising a light-reflective material or a light-absorbing material.

2. The LED package of claim 1, wherein the plurality of light-filtering materials comprises a plurality of light-filtering particles.

3. The LED package of claim 1, wherein the plurality of light-filtering materials comprises a plurality of light-filtering ionic species that are incorporated within a host material of the cover structure.

4. The LED package of claim 1, wherein the cover structure comprises glass, and the plurality of light-filtering materials are integrated within the glass.

5. The LED package of claim 1, further comprising a lumiphoric material between the cover structure and the at least one LED chip, the lumiphoric material configured to convert a portion of the light in the first peak wavelength range to light with a second peak wavelength range.

6. The LED package of claim 5, wherein the light-filtering materials are configured to reduce greater amounts of light within at least a portion of the first peak wavelength range that exit the cover structure than amounts of light within the second peak wavelength range.

7. The LED package of claim 5, wherein the light-filtering materials are configured to reduce amounts of light within at least a portion of the second peak wavelength range that exit the cover structure.

8. The LED package of claim 1, wherein the light-filtering materials are configured to reduce emissions of wavelengths of light below 400 nanometers that exit the cover structure.

9. The LED package of claim 1, wherein the light-filtering materials are configured to reduce emissions of wavelengths of light above 700 nanometers that exit the cover structure.

10. The LED package of claim 1, further comprising lumiphoric material particles dispersed with the light-filtering materials within the cover structure.

11. The LED package of claim 1, wherein the light-filtering materials are arranged with higher concentrations near peripheral edges of the cover structure than central portions of the cover structure.

12. The LED package of claim 1, wherein the light-filtering materials are arranged with higher concentrations along central portions of the cover structure than near peripheral edges of the cover structure.

13. The LED package of claim 1, wherein the light-filtering materials are arranged with concentrations that vertically vary within the cover structure relative to the LED chip.

14. The LED package of claim 1, wherein the light-filtering materials comprise at least a first filter type and a second filter type, and the second filter type is configured to selectively filter a different wavelength range than the first filter type.

15. A light-emitting diode (LED) package comprising:

a submount;

at least one LED chip on the submount; and a plurality of photochromic particles provided on the at least one LED chip, the plurality of photochromic particles being devoid of lumiphoric materials and configured to variably scatter light from the at least one LED chip based on relative intensity of the light from the at least one LED chip.

16. The LED package of claim 15, wherein the plurality of photochromic particles are configured to decrease scattering of the light from the at least one LED chip when the intensity of light from the at least one LED chip decreases.

17. The LED package of claim 15, further comprising a cover structure on the at least one LED chip, wherein the plurality of photochromic particles are dispersed within the cover structure.

18. The LED package of claim 17, further comprising light-filtering particles dispersed within the cover structure.

19. The LED package of claim 17, further comprising lumiphoric material particles dispersed within the cover structure.

20. The LED package of claim 19, wherein the plurality of photochromic particles are configured to decrease scattering of light from the lumiphoric material particles when the intensity of light from the at least one LED chip decreases.

21. The LED package of claim 15, wherein the plurality of photochromic particles comprise one or more of organic compounds, silicate photochromic glasses containing silver halide microcrystals, and activated crystals of alkali metal-halide compounds.

22. A light-emitting diode (LED) package comprising:

a submount;

at least one LED chip on the submount, the at least one LED chip being configured to generate light in a first peak wavelength range;

a cover structure on the at least one LED chip, the cover structure comprising a plurality of light-filtering materials integrated within the cover structure, the light-filtering materials configured to reduce emissions of wavelengths of light above 700 nanometers that exit the cover structure; and a light-altering layer on a portion of the submount adjacent the at least one LED chip, the light-altering layer further arranged directly along lateral edges of the at least one LED chip and along lateral edges of the cover structure, the light-altering layer comprising a light-reflective material or a light-absorbing material.

* * * * *